(12) United States Patent
Ono et al.

(10) Patent No.: US 6,403,453 B1
(45) Date of Patent: Jun. 11, 2002

(54) DOSE CONTROL TECHNIQUE FOR PLASMA DOPING IN ULTRA-SHALLOW JUNCTION FORMATIONS

(75) Inventors: Yoshi Ono, Camas; Yanjun Ma, Vancouver; Sheng Teng Hsu, Camas, all of WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 09/626,837

(22) Filed: Jul. 27, 2000

(51) Int. Cl.$^7$ ................................................ H01L 21/26
(52) U.S. Cl. ...................................................... 438/513
(58) Field of Search ................................ 438/513, 935, 438/948, 949; 118/723 E, 723 I, 723 IR, 723 MP; 204/298.06, 298.34; 250/492.2

(56) References Cited

U.S. PATENT DOCUMENTS

| | | | |
|---|---|---|---|
| 4,912,065 A | * | 3/1990 | Mizuno et al. |
| 5,183,777 A | | 2/1993 | Doki et al. ................. 437/160 |
| 5,711,812 A | * | 1/1998 | Chapek et al. |

OTHER PUBLICATIONS

Article entitled, "Plasma Doping: Progress and Potential" by P.K. Chu, S.B. Felch, P. Kellerman, F. Sinclair and L. A. Larson, published in Solid State Technology, Sep. 1999, pp. 55–56, 59–60 (Part One of One).

Article entitled, "Plasma Doping: Progress and Potential" by P. K. Chu, S. B. Felch, P. Kellerman, F. Sinclair and L. A. Larson, published in Solid State Technology, Oct. 1999, pp. 7777–78, 81–82 (Part Two of Two).

\* cited by examiner

*Primary Examiner*—Keith Christianson
(74) *Attorney, Agent, or Firm*—Matthew D. Rabdau; David C. Ripma; Scott C. Krieger

(57) ABSTRACT

A method of plasma doping substrates is provided. The substrate is covered with photoresist and placed within a plasma chamber. A doping gas is introduced into the chamber and ionized. A dilutant gas is also introduced to provide better control of the total amount of dosage associated with a given duration of exposure. The dilutant gas is preferably monatomic to reduce, or eliminate, affects associated with pressure variations within the chamber caused by dissociation of elements within the plasma chamber. The dilutant gas preferably contains lighter elements so as to reduce, or eliminate, damage to the photoresist caused by ion impacts. The dilutant gas is preferably neon or helium. The present method provides a means to better control the dosage and reduce photoresist damage and contamination.

10 Claims, 2 Drawing Sheets

DOSE CONTROL TECHNIQUE FOR PLASMA DOPING IN ULTRA-SHALLOW JUNCTION FORMATIONS

BACKGROUND OF THE INVENTION

This invention relates generally to semiconductor technology and more particularly to a method of plasma doping a substrate.

One common modern method of doping uses ion implantation. Ion implantation is conventionally performed using very expensive equipment. The expensive equipment requires high throughput to justify the cost of ownership. Techniques are being developed that offer an alternative to conventional ion implantation. These techniques are directed toward low energy, low dose applications, such as those used to produce source/drain extensions for CMOS transistors. As the dimensions of CMOS transistor structures get smaller, shallower junctions are required to maintain, or improve, overall performance of CMOS transistors. Plasma doping is an emerging technology that addresses the needs for shallow junctions, volume of throughput and cost of ownership.

Plasma doping is a method of doping accomplished by ionizing gas to form plasma, and exposing a substrate to the ions produced such that the ions are implanted into the substrate. In plasma doping technology, a plasma is produced by applying radio-frequency (RF) energy to a gas within a chamber. The plasma is created above the substrate to expose the substrate to ionized doping materials within the plasma. A pulsed negative voltage bias is applied to the substrate to attract the positively charged doping materials, also referred to herein as doping ions. The voltage bias amplitude dictates the implant depth distribution. The pulse width, frequency, partial pressure of the doping gas within the plasma, and implant duration control the dosage. If everything else is fixed, the more doping gas within the plasma chamber the higher the dosage. If only doping gas is present, each negative pulse will deliver a large portion the required dose. Diluting the doping gas with other gases will tend to reduce the dose attributable to individual voltage pulses. This will allow for greater control of the overall dose. Commonly used dilutant gases include, argon and hydrogen.

However, the partial pressure is not fixed. As the doping gas dissociates during the formation the plasma the partial pressure increases. Pressure chambers commonly have a pressure sensor and a pump to regulate the pressure within the plasma chamber while continually removing spent gases and potential contaminants. The increase in pressure caused by the dissociation of the doping gas within the chamber tends to cause the pressure system to respond in attempt to reduce the pressure to a predetermined value. This in turn sets up an oscillating pressure within the chamber, as the pressure increases due to dissociation, and then decreases due to pumping only to increase again. This oscillating pressure reduces control over total dosage. A dilutant gas such as hydrogen, which dissociates into hydrogen ions, will also tend to increase the pressure.

Another problem is that the presence of dilutant gas may damage photoresist. Heavy ions such as argon tend to damage the photoresist due to the high energies associated with their impact. This photoresist damage removes photoresist material, which may then redeposit onto the substrate causing contamination.

It would be advantageous to have a method of plasma doping that would reduce, or eliminate, the effects of oscillating pressure within the plasma chamber.

It would be advantageous to have a method of plasma doping that would provide more accurate control of implant duration.

It would be advantageous to have a method of plasma doping that would not produce contamination from redeposition of photoresist.

SUMMARY OF THE INVENTION

Accordingly, a method of plasma doping silicon substrates is provided. A silicon substrate is placed within a plasma chamber on a chuck. A voltage bias is applied to the chuck to bias the substrate. Preferably, the voltage bias will be negative pulses. A gas is introduced into the plasma chamber and energized to ignite a plasma, whereby the substrate is exposed to the plasma. Preferably, the negative pulsed voltage bias will attract positive ions formed within the plasma to the substrate. The plasma is then extinguished and the voltage bias removed from the substrate.

Preferably, the gas will comprise a doping gas such as $B_2H_6$, $BF_3$, $PH_3$, and $AsH_3$. The gas will preferably further comprise a monatomic dilutant gas.

In a preferred embodiment of the present method, the substrate will be masked using photoresist to provide covered regions and uncovered regions. The uncovered regions will be exposed to the plasma and doped. To avoid contamination caused by redeposition of photoresist, which is caused by impact damage of ions within the plasma, a light dilutant gas will preferably be used such as neon or helium.

DETAILED DESCRIPTION OF THE INVENTION

Figure 1:
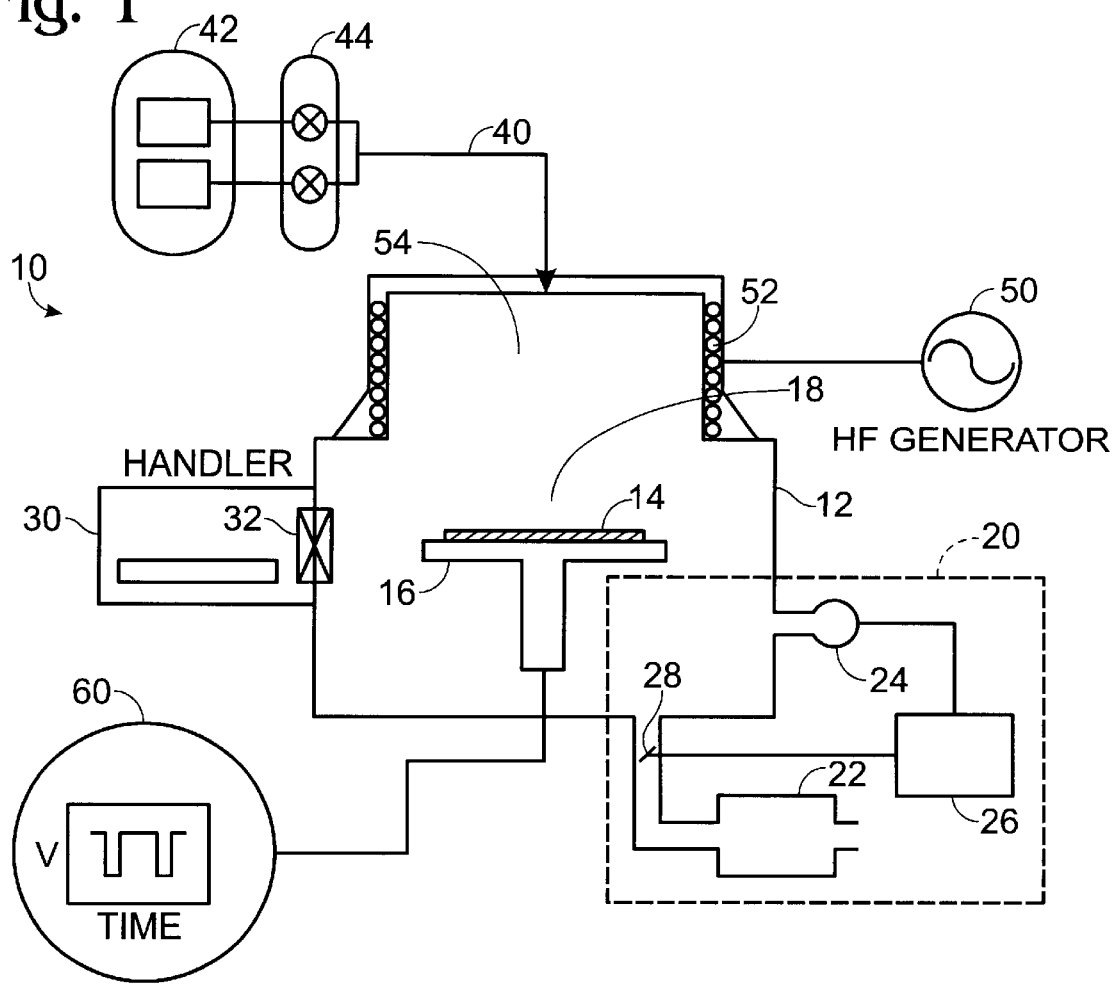
FIG. 1 is a schematic cross-sectional view showing a plasma chamber used an embodiment of the present method.

FIG. 1 is a schematic illustration of a suitable plasma doping system 10 for carrying out the plasma doping method of the present invention.

Plasma doping system 10 includes a plasma chamber 12 of a size suitable for holding one or more substrates 14, which are supported in chamber 12 on a chuck 16. Substrate 14 is also commonly referred to as a "wafer". As is typical in such chambers, chamber 12 has an interior 18 that can be evacuated. Pressure within interior 18 of chamber 12 can be regulated by a pressure control system 20.

Pressure control system 20 includes a pump 22 for exhausting spent gases and contaminants, if any. To control the pressure within interior 18 of plasma chamber 12, a pressure sensor 24 is connected to a pressure controller 26, which controls a throttle valve 28. When pressure controller 26 determines that sensor 24 has detected a pressure within interior 18 of chamber 12 outside of a predetermined range, pressure controller 26 adjusts throttle valve 28 to increase or decrease the pressure within interior 18 as necessary.

Individual substrates 14 can optionally be moved in and out of chamber 12 by a suitable handler 30 through a gate valve 32 in a chamber wall, allowing substrates to moved onto chuck 16 for processing, and then removed from the chamber following processing. The mechanism by which substrates are introduced into the chamber is not critical to the method of the present invention.

Selected gases used in plasma doping are introduced into chamber 12 through a suitable manifold system 40 from various gas supply reservoirs (indicated collectively at 42), controlled by valves (indicated at 44). For simplicity only two gas supply reservoirs 46 and 48 are shown. It is entirely possible, and not inconsistent with the present invention, to have additional gas supply reservoirs, or only a single supply reservoir containing a mixture of any desired gases. The manifold system 40, which is indicated schematically, may include a gas inlet region for blending the gases or a showerhead for distributing the gases within chamber 12 (neither of which are shown).

Plasma energy is supplied to chamber 12 by an RF generator 50 that typically supplies high frequency (HF) RF power through coils 52 to energize gases within interior 18 of chamber 12 to form a plasma within plasma formation region 54. The process of energizing gases to form a plasma is also referred to as "igniting a plasma".

The plasma formed within chamber 12 contains ions, including doping ions. Doping ions are ions that contain at least one atom of a desired doping material. The ions within the plasma are positively charged. To increase and control doping energies, a negative voltage bias 60 (shown schematically) is applied to the substrate 14 by applying the negative voltage bias to the chuck 16. Negative voltage bias 60 attracts the positively charged ions within the plasma producing higher implant energies, which corresponds to deeper implant depth. The use of a steady voltage bias will result in positively charged ions accumulating on an upper surface of substrates 14. The accumulation of positively charged ions on the upper surface will, at least partially, repel subsequent positively charged ions, reducing their implant energies. By pulsing the voltage bias, positive ions at the upper surface of substrate 14 have an opportunity to attract electrons and become electrically neutral when the voltage bias is not negative. In a preferred embodiment, the voltage bias pulses from zero to a negative voltage. Alternatively, the voltage bias can oscillate between negative pulses and positive pulses. The voltage amplitude of the negative pulse dictates the implant depth distribution within the surface of substrate 14. The pulse width, and frequency of the negative voltage bias pulse partially determine the implant dose.

The implant dose is also a function of the total amount of dopant ions within the plasma and accordingly the pressure within chamber 12. When only a doping gas is present the dosage per pulse is going to be higher. This makes controlling the total dosage more difficult. Also any variation in pressure, or variations in pulse width or frequency of the voltage bias will cause greater variation in the total dosage due to the greater dosage associated with each pulse. Introducing other non-doping gases, also referred to as dilutant gases, can reduce the overall percentage of doping gas within the chamber decreasing the dose associated with each pulse. These introduced gases will be ionized as well as the doping gases. These additional ions will be attracted to the substrate 14 and strike the surface. In many instances these ions will have sufficient energy to damage photoresist that may be present for masking purposes. The energy of the ion and the corresponding damage is dependent upon the ion's mass. Accordingly, dilutant gas used in the method of the present invention should preferably contain lighter elements as opposed to heavy elements.

Figure 2:
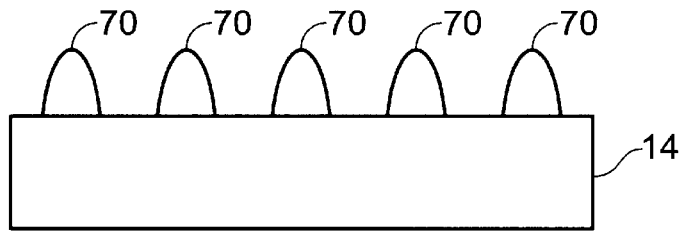
FIG. 2 illustrates photoresist damage caused by heavy ions.

FIG. 2 illustrates photoresist damage that may be caused by the presence of certain dilutant gases, for example argon. A substrate 14 has photoresist features 70 which have been damaged forming at least partially rounded upper edges.

Figure 3:
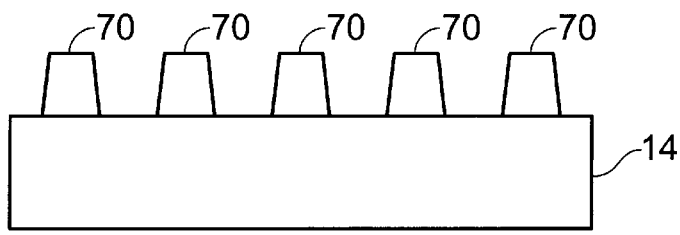
FIG. 3 illustrates the desired lack of photoresist damage achieved by an embodiment of the present method.

For comparison, FIG. 3 shows a desired photoresist pattern without any significant damage. Photoresist pattern 70 does not have rounded edges caused by impact damage.

Referring again to FIG. 2, a portion of the material removed by successive ion impacts causing the rounded upper edges will subsequently redeposit on substrate 14 contaminating the surface.

In normal operation, when a doping gas is introduced into plasma doping system 10, described above, the formation of plasma within interior 18 of chamber 12 causes the pressure within chamber 12 to increase. This is caused by the dissociation of the elements that make up the doping gas. The doping gases are preferably selected from the group consisting of $B_2H_6$, $BF_3$, $PH_3$, and $AsH_3$. For example, in the case of $PH_3$ ions of phosphorous (P) and hydrogen (H) are formed within the plasma. The dissociation of $PH_3$ into P and H increases the pressure within chamber 12. The increase in pressure within chamber 12 causes pressure control system 20 to respond by attempting to decrease the pressure. The combination of dissociation related pressure increases and the response of the control system produces oscillating pressure changes within chamber 12. These oscillating pressure changes make precisely determining and controlling the doping concentration difficult. The presence of a properly selected dilutant gas will tend to reduce, or eliminate, the oscillating pressure changes within plasma doping system 10. The dilutant gas should preferably be selected from gases that will not dissociate within chamber 12 during the formation of plasma. Preferably, the gas will be monatomic. These monatomic gases are inert gases such as argon, neon, or helium. As discussed above, since argon causes photoresist damage, the dilutant gas will preferably be neon or helium. The amount of dilutant gas used to reduce, or eliminate, pressure oscillations is such that the ratio of dopant gas to dilutant gas will be in the range of 25:75 to 5:95.

Figure 4:
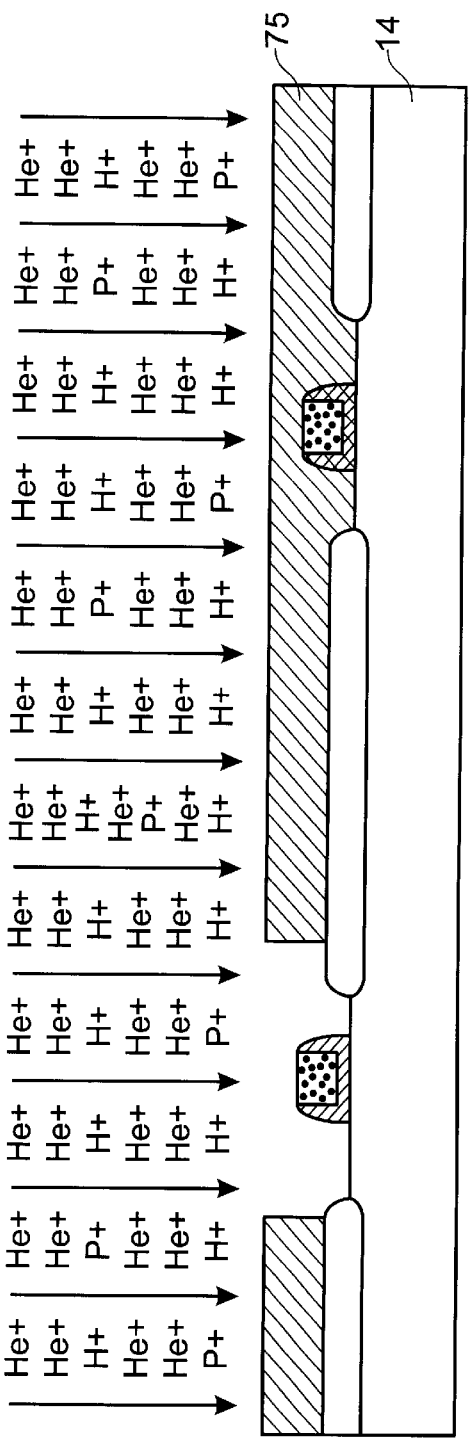
FIG. 4 is an illustration showing ion implantation using dilutant gas.

FIG. 4 illustrates the plasma implantation method. Substrate 14 is shown with transistor structures (which are for illustration purposes only). A photoresist layer 75 covers areas to be protected from ion implantation. Phosphine has been introduced as the doping gas along with helium dilutant gas. The phosphine has dissociated into phosphorous ions and hydrogen ions. The ions are positively charged and are attracted to substrate 14 by the negative voltage bias (not shown) to implant phosphorous into the exposed regions of substrate 14.

Once the effects of pressure oscillation have been sufficiently reduced, or eliminated, it may be possible to further control the total dose of dopant ions implanted. Even without the voltage bias being applied, some ions will implant into substrate 14 due to the energy they acquire when the plasma is formed. In the prior art, it is typical to create the plasma prior to initiating the voltage bias. Also the plasma my continue after the voltage bias is removed. The additional implantation without a voltage bias makes fine control of the dosage more difficult.

Figure 5:
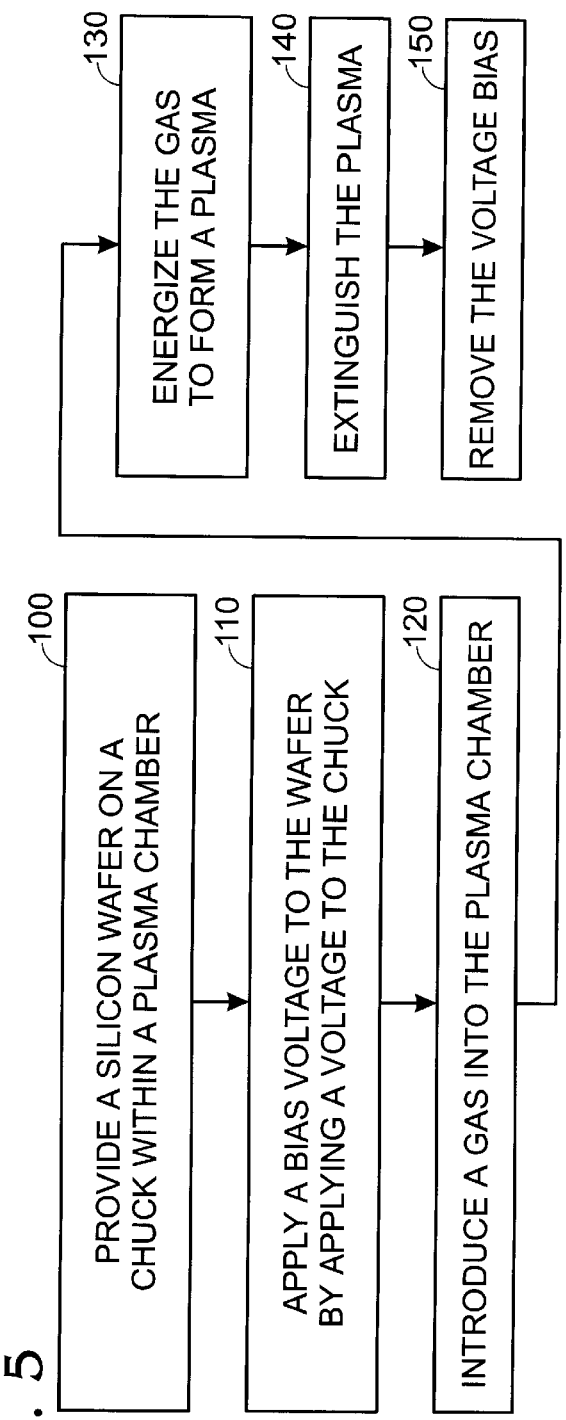
FIG. 5 is a flowchart showing an embodiment of the process of the present invention.

Referring now to FIG. 5, a process according to the present invention is shown as a flow chart. Step 100 provides a silicon wafer on a chuck within a plasma chamber. Preferably, the silicon wafer has been patterned with photoresist. Step 110 applies a bias voltage to the wafer by applying a voltage to the chuck. Preferably the bias voltage will be a pulsed negative bias voltage. Step 120 introduces a gas into the plasma chamber. The gas preferably comprises a doping gas and a dilutant gas. The dilutant gas is preferably neon or helium. Step 130 energizes the gas igniting a plasma. The applied voltage bias attracts the ions within the plasma to dope the exposed substrate. Step 140 extinguishes the plasma and finally in step 150 the voltage bias is removed. By igniting the plasma only when the voltage bias is applied provides more predictable dosage. This is because the amount of gas doped into the substrate and the distribution within the substrate can be determined for a given duration at a specific bias voltage, pulse width, and frequency provided that the partial pressure of the dopant gas is also known and controlled. By eliminating tail effects of doping without a bias, the total bias can be more readily and accurately determined.

Additional alternative embodiments are possible within the scope of the present invention. Other variations of the method, or material, within the scope of the present invention will occur to those of ordinary skill in the art. Accordingly, the foregoing disclosure and description thereof are for illustrative purposes only and are not intended to limit the invention. This invention is defined by the claims.

What is claimed is:

1. A method of plasma doping silicon substrates comprising the steps of:
    a) providing a silicon substrate within a plasma chamber;
    b) applying a voltage bias to the substrate;
    c) introducing a gas into the plasma chamber;
    d) igniting the gas to produce a plasma whereby the substrate is exposed to the plasma; and
    e) extinguishing the plasma prior to removing the voltage bias from the substrate.

2. A method of plasma doping silicon substrates comprising the steps of:
    a) providing a silicon substrate within a plasma chamber;
    b) applying a voltage bias to the substrate, wherein the voltage bias is pulsed;
    c) introducing a gas into the plasma chamber;
    d) igniting the gas to produce a plasma whereby the substrate is exposed to the plasma;
    e) extinguishing the plasma; and
    f) removing the voltage bias from the substrate.

3. The method of claim 1, wherein the gas comprises a doping gas.

4. The method of claim 3, wherein the doping gas is selected from the group consisting of $B_2H_6$, $BF_3$, $PH_3$, and $AsH_3$.

5. The method of claim 3, wherein the gas further comprises a dilutant gas.

6. The method of claim 5, wherein the dilutant gas is a monatomic gas.

7. The method of claim 6, wherein the dilutant gas is helium, or neon.

8. A method of selectively plasma doping a semiconductor substrate comprising the steps of:
    a) masking areas of the semiconductor substrate with photoresist to provide covered regions and uncovered regions; and
    b) exposing within a plasma chamber the substrate masked with photoresist to a plasma comprising a doping gas and a dilutant gas, wherein the doping gas is selected from the group consisting of $BF_3$, $PH_3$, and $AsH_3$, and the dilutant gas is Ne, to dope uncovered regions without doping covered regions.

9. A method of selectively plasma doping silicon comprising the steps of:
    a) masking areas of a semiconductor substrate with photoresist to prevent doping of covered regions;
    b) placing the substrate within a plasma chamber;
    c) applying a pulsed bias voltage to the substrate;
    d) introducing a gas comprising a doping gas and a dilutant gas selected from the group consisting of neon and helium into the plasma chamber;
    e) igniting the gas to produce a plasma whereby the substrate is exposed to the plasma;
    f) extinguishing the plasma;
    g) removing the voltage bias from the substrate.

10. The method of claim 9, wherein the doping gas is selected from the group consisting of $B_2H_6$, $BF_3$, $PH_3$, and $AsH_3$.

* * * * *